United States Patent [19]

Burrell

[11] Patent Number: 4,991,892

[45] Date of Patent: Feb. 12, 1991

[54] REMOTE CONTROL HOLDER

[76] Inventor: Dale E. Burrell, 4912 Reynolds Ct., Pontiac, Mich. 48054

[21] Appl. No.: 339,975

[22] Filed: Apr. 18, 1989

[51] Int. Cl.⁵ .......................... A47F 7/00; B65D 69/00
[52] U.S. Cl. ........................................ 294/1.1; 211/13; 248/205.2; 294/143; 294/146
[58] Field of Search ................. 294/1.1, 25, 27.1, 137, 294/141–149, 151, 159–163, 165; 16/110 R, 114 R, 124, 125; 24/3 R, 442; 211/1, 13, 60.1, 70.1; 224/101, 901; 248/176, 188.1, 188.7, 205.2, 309.1, 310, 346, 682, 683, 694; 273/148 B

[56] References Cited

U.S. PATENT DOCUMENTS

| D. 280,466 | 9/1985 | Seltzer . | |
|---|---|---|---|
| 4,660,792 | 4/1987 | Rogalski | 248/205.2 X |
| 4,712,693 | 12/1987 | Striplin | 211/13 X |
| 4,739,887 | 4/1988 | Beach | 211/13 |
| 4,745,397 | 5/1988 | Lagerbauger . | |
| 4,815,683 | 3/1989 | Ferrante | 248/205.2 |
| 4,848,609 | 7/1989 | Meghnot | 248/309.1 X |
| 4,852,746 | 8/1989 | Wells et al. | 211/13 |
| 4,856,658 | 8/1989 | Novak | 211/13 |
| 4,884,713 | 12/1989 | Handler | 248/205.2 X |

OTHER PUBLICATIONS

Video Link Division of Xantech Corporation 12950 Bradley Ave., Sylmar, Calif. 91342, "The Cockpit Remote Control Amplifier Organizer".

Primary Examiner—Johnny D. Cherry
Attorney, Agent, or Firm—Basile and Hanlon

[57] ABSTRACT

A holder for audio and video remote controls and the like which includes a plurality of elongate support members to which at least one remote control can be attached. The elongate support members are spaced apart and attached to an integral body which form gaps wide enough for a hand to grasp an individually attached remote control device in a normal operating manner. The attached remote control is supported in an upright position thereby and is easy to locate. The plurality of attached remote controls provides an economical and convenient method of using the various remote controls to manipulate audio and video instruments. The body of the remote control holder may include a orifice for handy storage and use of literature pertaining to television programming, video tape recorder instructions, and the like.

18 Claims, 1 Drawing Sheet

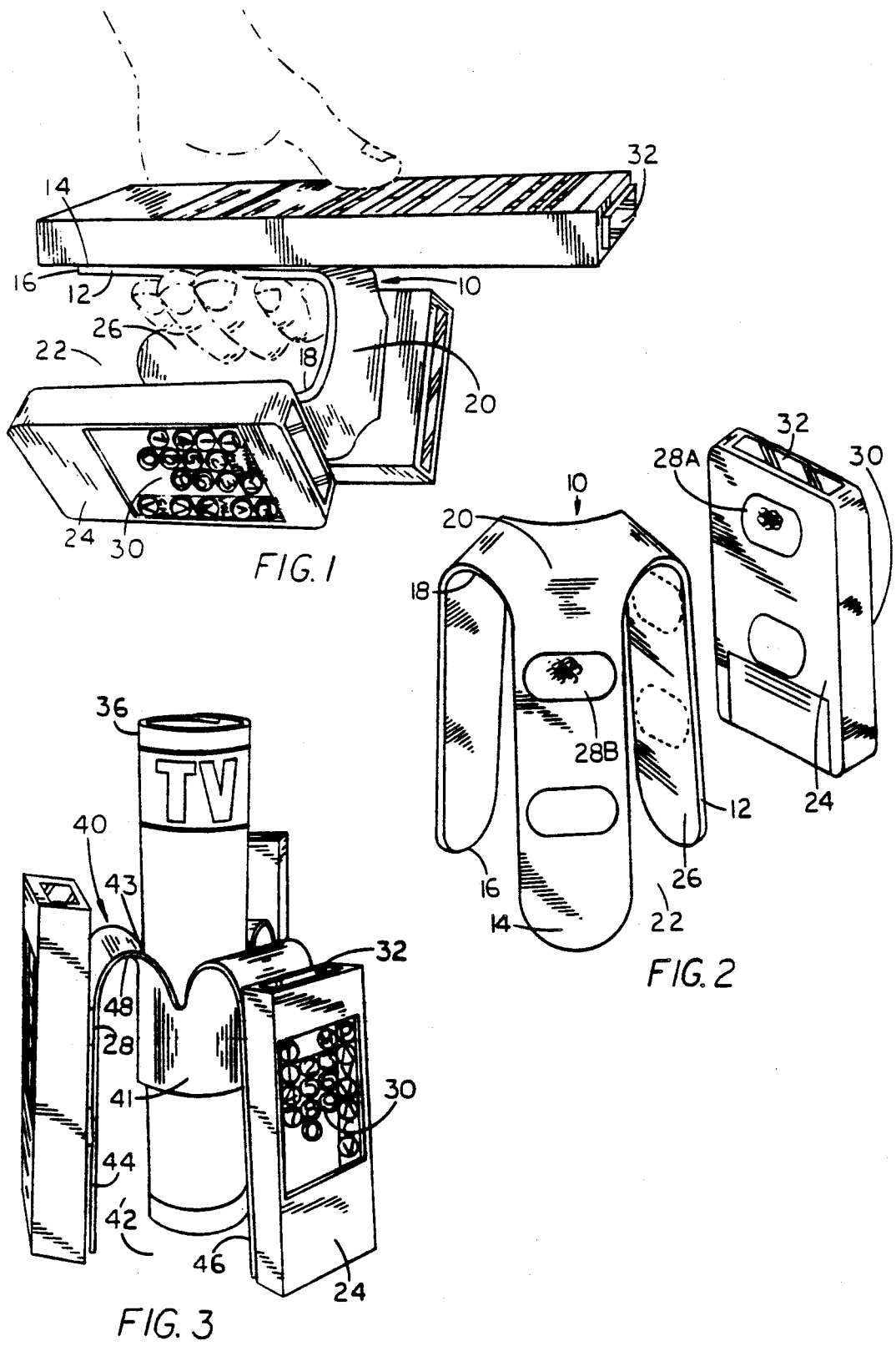

REMOTE CONTROL HOLDER

BACKGROUND OF THE INVENTION

I. Field of the Invention

This invention relates generally to the field of article holders and, more particularly, to the field of holders pertaining to visual and audio remote control devices thereof.

II. Description of the Prior Art

Heretofore most remote control devices are singular in a physical and functional use. With the advent of a multiplicity of visual and audio instruments, i.e. television, video cassette recorders, cable converters, audio cassette, and compact disc players and recorders, to name a few, with each instrument having its own individual remote control device, problems have arisen in their use. One of the problems is misplacing the remote control device, which can be lost under papers or in the cracks between cushions on the sofa and chairs, can be carried to another room or put in the pocket of a robe. Another problem with individual remote control devices is that more than one remote control device is needed during normal operation of the various instruments. For example, to watch and video tape a televised broadcast may often require three remote control devices, a cable converter to turn the device on and select the proper station, a remote control device to turn the television set on and control the volume and a device to turn on the video tape recorder and start the cassette tape.

The interdependent use of dedicated remote control devices has prompted the invention of a singular remote control device that will control the functions of a plurality of dedicated remote control devices. However these multiple use remote control devices are costly, and still easily misplaced; in their use, recognizing the proper mode and the proper push button to use is confusing, because the same push button has different uses as the mode is changed for the various instruments.

It would be desirable to provide a simple and inexpensive support which would hold a plurality of remote control devices that would allow convenient and complete remote operation of various video and audio implements, and be easily located when needed.

SUMMARY OF THE INVENTION

The invention disclosed herein is a holder for remote control devices. The remote control holder is an economical, molded or formed one-piece support, having three or more support members. The outer surface of the support members comprises a mounting surface for at least one remote control device. The remote control device may be fastened with mating hook and loop type fastener strips sold under the trademark VELCRO with the signal emitting surface directed away from the base of the support member. The remote control device can be easily operated with normal hand manipulation. Placing the fingers through the gaps between the support members and around a support member with an attached remote control device, the remote control holder is lifted. Operation of the remote control device is in the normal hand-held manner.

The remote control holder with one or more remote control devices attached comprises an upright object that is easy to locate.

Located in the body of the remote control holder could be a convenient tubular orifice that may hold booklets or papers relating to television programming or instructions to operate video tape recorders, etc.

DRAWING FIGURES

FIG. 1 is a perspective view of one embodiment of the remote control holder in use, a hand-held illustration with three remote control devices attached.

FIG. 2 is a perspective view of the remote control holder showing the placement of velcro strips on the holder and on the remote control device.

FIG. 3 shows a second embodiment of the remote control holder setting on a horizontal surface, having in addition a tubular orifice that can be used to hold literature such as a television program guide, instructional literature for the remotely controlled instruments, or the like.

DRAWING REFERENCE NUMERALS

10 REMOTE CONTROL HOLDER
12 SUPPORT MEMBER
14 MOUNTING SURFACE
16 BASE
18 SHOULDER
20 BODY
22 GAPS
24 REMOTE CONTROL DEVICE
26 HANDLE SURFACE
28 VELCRO STRIPS
28A VELCRO LOOP
28B VELCRO HOOK
30 PUSH BUTTONS
32 SIGNAL EMITTING SURFACE
34 ORIFICE
36 TV PROGRAMMING BOOKLET
40 REMOTE CONTROL HOLDER
41 BODY
42 GAPS
43 ORIFICE
44 SUPPORT MEMBER
46 HANDLE SURFACE
48 SHOULDER

DETAILED DESCRIPTION OF THE PREFERRED EMBODIMENTS

Throughout the following description and drawings, identical reference numbers are used to refer to the same components shown in FIGS. 1, 2 and 3 of the drawings except where noted.

Referring now to the drawing FIGS. 1, 2 and 3, there is illustrated a remote control holder 10 of the present invention that may be formed or molded of plastic or metal comprising a plurality of support members 12, each having a flat mounting surface 14 that extends from the base 16 to the shoulder 18. The shoulder 18 is integral with the body 20 so that the support members 12 are positioned to provide gaps 22. The gaps 22 are large enough for a hand to reach through and grasp the attached remote control device 24 and the handle surface 26.

Referring now to FIG. 2, a remote control device 24 is positioned to be attached to the remote control holder with mating hook and loop type fastener strips 28 sold under the trademark VELCRO. The loop material 28A is fastened to the remote control device 24 opposite the push buttons 30. The mating hook material 28B is fastened to the remote control holder 10 support member 12 mounting surface 14 as shown. Alternately, double faced adhesive foam tape may be mounted on one of the remote control device 24 or the support member 12 to releasably attach the remote control device 24 to the holder 10. The remote control device 24 is attached to the remote control holder, 10, after orienting the remote control device 24 signal emitting surface 32 towards the shoulder 18, away from and flush with the base 16, the remote control device 24 being positioned longitudinally central to the support member 12.

In FIGS. 1 and 2, the body 20 in the remote control holder 10 is a platform design. In a second embodiment, FIG. 3, the body 41 comprises a tubular orifice 43 that may hold a Tv programming booklet 36, and/or instructions for operating a video tape recorder, etc.

At rest, referring to FIG. 3, the assembled remote control holder 40 rests on a horizontal surface such as a table. In use, referring now to FIG. 1, to operate a remote control device 24, the fingers of the user are placed through the gap 22 between two support members 12 and against the handle surface 26. By raising the hand, the index finger will come in contact with the shoulder 18. This will allow the remote control holder 10 to be lifted without using the thumb to grasp the remote control device 24. This reduces the risk of accidental signals being sent from the push buttons 30 to the remote control receiver. The user can, then, direct the signal emitting surface 32 towards the remotely controlled instrument and operate push buttons 30 in the normal manner by using the fingers of the free hand or the thumb of the hand holding the remote control holder 10.

To operate a control device 24 mounted on the holder 40 inm FIG. 3, the fingers of the user are placed through the gap 42 between two support members 544 and against the handle surface 46. By raising the hand, the index finger will come in contact with the shoulder 48. This will allow the remote control holder 40 to be lifted without using the thumb to grasp the remote control device 24.

Selecting another remote control device 24 while holding the assembled remote control holder 10 or 40 is easily accomplished with several methods. Two are described here. The remote control holder 10 or 40 can be placed on a horizontal surface, another attached remote control device 24 selected and the process repeated in the above described manner. Alternately, even hand-over-hand movement can be used to pass an adjacent attached remote control device 24 to the operating hand.

While two embodiments of the invention have been described in detail above, it will be apparent to those skilled in the art that the disclosed embodiments may be modified. For example, it is possible to use different materials such as wood or wire. One would also be able to change the shape and dimensions of the various embodiments. One could make a platform or an arch with hand openings provided to manipulate the various remote control devices. An upside down "T" shape could support remote control holders back to back or the upside down "T" shape support could be formed to provide hand openings. Therefore, the foregoing description is to be considered exemplary rather than limiting and the true scope of the invention is that defined in the following claims.

I claim:

1. A holder for multiple remote control devices comprising:
   a central body;
   a plurality of elongate support members integrally formed with and extending outwardly and downwardly from the central body, each support member including:
   (a) a shoulder portion attached to and contiguous with the central body;
   (b) a base opposed to the shoulder portion;
   (c) opposed side edges extending from the shoulder portion to the base, the side edges of each support member being spaced from the side edges of adjacent support members to form gaps between the support members; and
   (d) an outwardly oriented face; and
   means for releasably attaching a selected remote control device to the outwardly oriented face.

2. The holder of claim 1 further comprising an orifice positioned in the said body of said holder of sufficient size to accept literature.

3. The holder of claim 2 wherein the orifice is tubular in shape.

4. The holder of claim 1 being formed of a plastic material.

5. The holder of claim 1 being formed of sheet metal.

6. The holder of claim 1 wherein the releasably attaching means is adhesive-backed VELCRO strips.

7. The holder of claim 1 wherein the releasably attaching means is double faced adhesive foam tape.

8. A hand held holder for remote control devices comprising: a body integrally joined with a plurality of leg-like elongate support members, said support members having a flat surface of sufficient size to support at least one attached remote control device, said support members terminating away from the said body as bases that support the said holder and said attached remote control device; said elongate support members being separated by gaps large enough to allow a hand to grasp the attached said remote control device and an associated one of said support members.

9. The holder of claim 8 further comprising a shoulder on each of the elongate support members, said shoulder being positioned to contact the index finger while lifting the said holder.

10. The holder of claim 8 further comprising an orifice in the body of said holder of sufficient size to accept literature.

11. The holder of claim 10 wherein the orifice is tubular in shape.

12. The holder of claim 8 being formed of a plastic material.

13. The holder of claim 8 being formed of sheet metal.

14. The holder of claim 8 further including means for releasably attaching a selected remote control device to flat surface on the support members, the attaching means being adhesive-backed VELCRO strips.

15. The holder of claim 8 further including means for releasably attaching a selected remote control device to a flat surface on the support members, the attaching means being double faced adhesive foam tape.

16. A holder for multiple remote control devices comprising:
   a central body;
   a plurality of elongate members integrally formed with and extending outwardly and downwardly from the central body, each elongate member including:
   (a) an outwardly oriented face; and
   means for releasably attaching selected remote control devices to the outwardly oriented face;

(a) each elongate member being spaced from adjacent elongate members to form gaps providing a means for grasping said holder.

17. The holder of claim 16 being formed of a rigid material.

18. The holder of claim 16 wherein the releasably attaching means is VELCRO strips.

* * * * *